United States Patent [19]
Prokopp et al.

[11] Patent Number: 6,150,825
[45] Date of Patent: *Nov. 21, 2000

[54] ELECTRIC CIRCUIT BOARD TESTER

[75] Inventors: Manfred Prokopp, Wertheim-Reicholzheim; Rudi Geier, Kulsheim-Hundheim; Volker Goldschmitt, Wertheim-Dörlesberg, all of Germany

[73] Assignee: ATG Test Systems GmbH, Wertheim, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/885,976

[22] Filed: Jun. 30, 1997

[30] Foreign Application Priority Data

Jul. 10, 1996 [DE] Germany .................. 196 27 801

[51] Int. Cl.⁷ ............................................. G01R 31/02
[52] U.S. Cl. ........................................ 324/537; 324/754
[58] Field of Search ................................ 324/737, 754

[56] References Cited

U.S. PATENT DOCUMENTS

| | | | |
|---|---|---|---|
| 3,564,408 | 2/1971 | Schulz et al. | 324/158 |
| 3,806,801 | 4/1974 | Bove | 324/72.5 |
| 4,417,204 | 11/1983 | Dehmel et al. | 324/73 PC |
| 4,674,006 | 6/1987 | Driller et al. | 361/393 |
| 4,707,657 | 11/1987 | Bøegh-Petersen | 324/158 F |
| 4,724,377 | 2/1988 | Maelzer et al. | 324/73 PC |
| 4,833,402 | 5/1989 | Boegh-Petersen | 324/754 |
| 4,851,765 | 7/1989 | Driller et al. | 324/158 F |
| 4,868,493 | 9/1989 | Becker | 324/537 |
| 4,952,872 | 8/1990 | Driller et al. | 324/158 F |
| 5,109,596 | 5/1992 | Driller et al. | 324/754 X |
| 5,132,613 | 7/1992 | Papae et al. | 324/754 |
| 5,434,513 | 7/1995 | Fujii et al. | 324/765 |
| 5,475,317 | 12/1995 | Smith | 324/760 |
| 5,534,784 | 7/1996 | Lum et al. | 324/757 |
| 5,672,978 | 9/1997 | Kimura | 324/754 |
| 5,764,071 | 6/1998 | Chan et al. | 324/754 |

FOREIGN PATENT DOCUMENTS

| | | | |
|---|---|---|---|
| 0 350 609 A2 | 1/1990 | European Pat. Off. | G01R 31/28 |
| 3240916A1 | 5/1984 | Germany | G01R 31/28 |
| 3340180C1 | 5/1985 | Germany | G01R 31/28 |
| 3630548A1 | 3/1988 | Germany | G01R 31/28 |
| 37 17 528 A1 | 12/1988 | Germany | G01R 31/28 |
| 195 11 565 A1 | 10/1996 | Germany | H01R 23/72 |
| 19627801C1 | 3/1998 | Germany | G01R 31/28 |

OTHER PUBLICATIONS

"Translator–Adaption im Test von Leiterplatten," EPP 421 Seite 47, Kenn–Nr. (Jan./Feb. 1994).
"Elektrische Prüfung feiner und feinster Strukturen, " Galvanotechnik, D–88348 Saulgau, (86/1995) Nr. 12, Seite 4121 (month unavailable).

*Primary Examiner*—Glenn W. Brown
*Attorney, Agent, or Firm*—Hamilton, Brook, Smith & Reynolds, P.C.

[57] ABSTRACT

An electric circuit board tester comprises a contact board (1) configured as a circuit board and contact elements on a testing side, for example its upper side, which can be connected to test points on the circuit board to be tested. The other side of the contact board has contact points (4) electrically connected to the contact elements via conductors (3). Electronic units (8) are releasably secured to the side of the contact board (1) comprising the contact points, such that a physical connection to the contact board (1) and an electrical connection between the electronic units (8) and the contact points (4) are simultaneously achieved.

26 Claims, 5 Drawing Sheets

ELECTRIC CIRCUIT BOARD TESTER

BACKGROUND OF THE INVENTION

1. Field of the Invention

The invention relates to an electric circuit board tester.

2. Description of the Prior Art

Electric circuit board testers are known for example from U.S. Pat. No. 3,564,408 and U.S. Pat. No. 4,417,204. These testers comprise a contact or test board on which test pins are arranged in a basic center-spacing. The test pins are connected via long leads to a test circuit. The circuit boards to be tested are placed on the contact board, whereby an adapter may be interposed between the circuit board and the test board so that an electrical contact is produced between each test point of the circuit board to be tested and a test pin.

It is against the background of such testers that modularly configured testers have been developed as are described in German Pat. Nos. 32 40 916 C2 and 33 40 180 C1. These testers comprise a mother-board locating a vertical arrangement of modules. Each of the modules covers part of the electronic test circuit and comprises test pins oriented vertically on its upper end. Several such modules are arranged juxtaposed in such a tester, the arrangement of the test pins forming a contact field replacing the contact board. So that the modules are securely held together, a perforated board may be located on the test pins so that each test pin passes through a hole in the perforated board, it thereby being positionally located.

This modular configuration of the contact field has a proven record of success and is popular in actual practice. One salient advantage of this modular configuration is that the contact pressure applied when testing a circuit board is passed on via the modules to the mother-board. The drawback is, however, that when a change is made to the center-spacing of the contact field all of the modules need to be replaced as a whole. This is why for cost reasons basic center-spacing is defined, which can only be changed at considerable financial expense.

SUMMARY OF THE INVENTION

It is thus the object of the invention to define an electric circuit board tester which is flexible in application and cost-effective in fabrication and use.

This object is achieved by an electric circuit board tester comprising a contact board configured as a circuit board. The contact board has on a test side, for example its upper side, that has contact elements adapted to electrically conductively connect to test points of the circuit board to be tested. The contact board's other side, for example its underside, comprises contact points electrically connected to the contact elements via conductors. Electronic units are releasably securable to the side of the contact board having the contact points to establish electrical connections with the contact points simultaneously with the establishment of a physical connection to the electronic units In specific embodiments, the contact points are arranged in groups on the contact board. The electronic units are secured to one wall of a connecting strip using screws, for example, and the contact board is secured to its other wall. A flex conductor may be arranged on the walls of the connecting strip in connection with the electronic unit and/or with the contact board. A rubber contact element may also be located between the flex conductor and the electronic unit or contact board to provide a conductive connection between the electrical leads of the flex conductor and the electronic unit.

In various embodiments, non-homogenous center spacings may be used between the contact elements. Alternatively, the arrangement of the elements may be identical to the test points of a circuit board to be tested.

In another embodiment, the electronic units comprise pressure boards supported by a mother-board and urging a pressure strip having contact springs against the contact points of the contact board. The electronic units are oriented by corresponding positioning pins and positioning holes on the contact board. A pressure mechanism, such as eccentric rods, is arranged between the pressure board and the motherboard, so that the pressure boards receive an upwardly, for example, acting force by the pressure mechanism.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The invention will now be described in more detail with reference to the drawings in which.

DESCRIPTION OF THE PREFERRED EMBODIMENTS

The circuit board tester in accordance with the invention comprises a contact board 1 preferably configured as a pad field board including several pad fields 2 serving as contact elements on its upper side. The pad fields 2 are preferably gold tabs, which ensure a good contact. In operation, an adapter with contact pins is mounted on the contact board 1, these contact pins contacting the pad fields 2.

Figure 1:
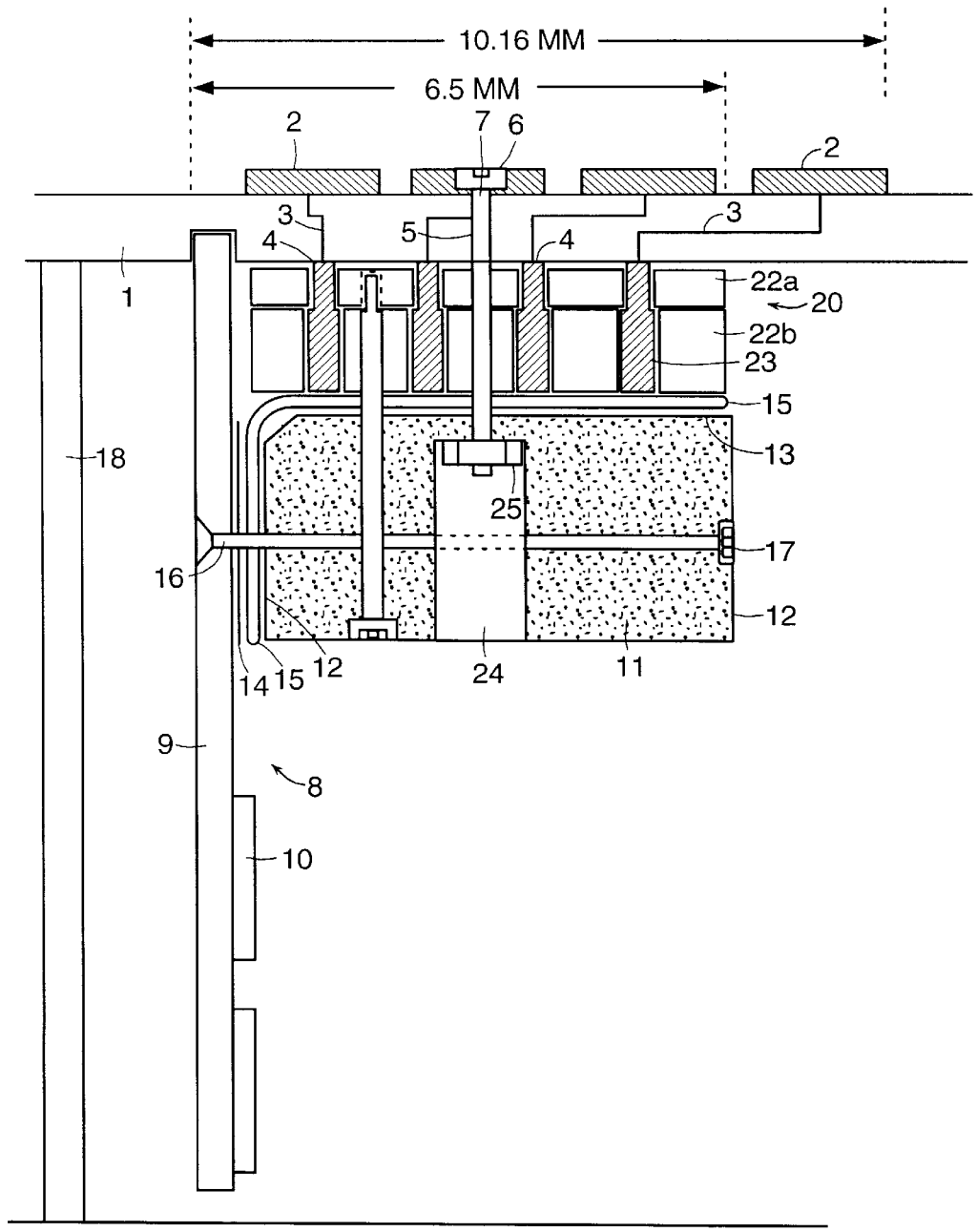
FIG. 1 is a schematic illustration of one portion of the tester in accordance with the invention shown in a cross-section, through the contact board.

On the underside of the contact board 1, contact points 4 are provided. Leading from each pad field 2 to one of the contact points 4 is a conductor 3, the contact points being arranged possibly in a very dense arrangement. The contact points 4 are preferably arranged grouped in rows, FIGS. 1 and 2 each illustrating a section through a group of four rows. By configuring the contact board 1 as a circuit board, the pad fields 2 and the contact points 4 can be arranged independently of each other on the contact board 1.

In such a group of contact points 4, vertical through-holes 5 are incorporated centrally in the contact board, each of these through-holes being arranged within a pad field 2, preferably centrally therein. In the region of the through-holes 5, counter-sinks 6 are incorporated in the pad fields 2.

These countersinks serve to receive the heads of screws 7 located in the through-holes.

By means of the screws 7, electronic units 8 are releasably secured to the underside of the contact board 1. The electronic units 8 comprise a vertically oriented circuit card 9, including electronic components 10, which together form part of the test circuit. This part usually contains the sampling or scanning components with which the individual test points of the circuit board are scanned in sequence.

In the end portion of the circuit card 9, a fastener strip 11 is secured to the circuit card 9. This strip is preferable made of a plastic material and features a rectangular cross-section comprising two narrow sidewalls 12 and two broad sidewalls 13. The fastener strip 11 is screwed by one of its narrow sidewalls 12 to the circuit card 9, (screws 16, nuts 17). A rubber contact element 14 and a flex conductor 15 are clamped to each other between the circuit card 9 and the fastener strip 11. The rubber contact element 14 is arranged between the circuit card 9 and the flex conductor 15. The flex conductor 15 is a flexible board having several electrical leads and corresponding contact pins.

Configured on the circuit card 9 in the contact portion of the rubber contact element 14 are contact pins. The rubber contact element 14 is conductive when exposed to physical pressure in the direction of the pressure so that it electrically connects the contact points of the circuit card 9 and the contact points of the electrical leads of the flex conductor 15 to each other. The flex conductor is guided from the narrow sidewall 12 to the upper broad sidewall 13 and is secured, for example, by a bonding agent to the fastener strip 11.

By means of the upper broad sidewall 13, the fastener strip 11 is secured to the underside of the contact board 1 in the region of the contact points 4. A receptacle connector 20 (FIG. 1) or a further rubber contact element 21 (FIG. 2) are arranged between the flex conductor 15 and the contact board 1 to provide the electrical contact between the flex conductor 15 and the contact points 4 of the contact board 1. The receptacle connector 20 is made up of two plastics strips 22*a*, 22*a* arranged one on the other in which through-holes corresponding to the arrangement of the contact points 4 are formed. These through-holes locate contact springs 23. The contact springs 23 have stepped side walls and comprise electrically conductive metal. Each of these contact springs is clamped in place between a contact point 4 of the contact board 1 and a contact point of the flex conductor 15 so that an electrical connection is established between one of the contact points 4 of the contact board 1 and an electrical lead of the flex conductor by each contact spring 23.

Figure 2:
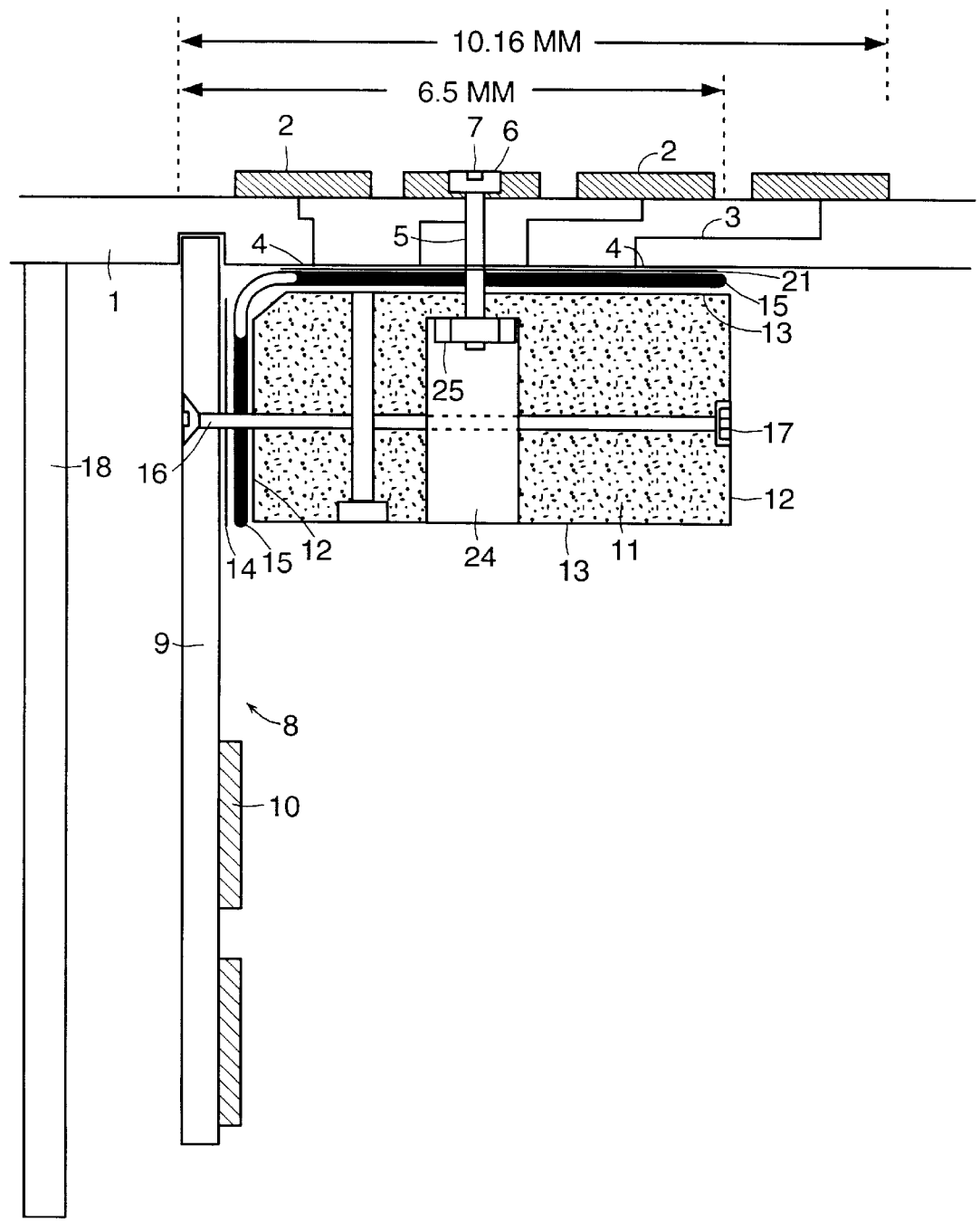
FIG. 2 is a simplified schematic illustration of one portion of the tester in accordance with the invention in a further embodiment shown in cross-section, through the contact board.

In the embodiment shown in FIG. 2, the electrical connection between the contact points 4 and the flex conductor 15 is produced by the rubber contact element 21 which is rendered conductive by being exposed to physical pressure in a direction orthogonal to its surface.

Each screw 7 arranged distributed longitudinally along the fastener strip 11 engages a nut 25 inserted in a recess 24 in the fastener strip 11, watchmaker-type screws being used as the screws 7.

The invention thus provides a contact board 1 to which one or more circuit cards are releasably securable, thereby producing both a physical and an electrical contact. A releasable connection is achievable by such a simple configuration, since hardly any room is available between the pad fields 2. This is why, in the illustrated embodiments and in accordance with the invention, the means for releasable connection—watchmaker screws—are located in the pad fields, it having been discovered that the pad fields, in which the screws are arranged, provide a sufficiently good electrical contact to the test pins of an adapter.

The configuration of the contact board 1 as a circuit board, as a result of which the pad fields 2 as well as the contact points 4 can be freely arranged, in combination with providing a releasable connection between the contact board 1 and the electronic units 8, make it possible to quickly and cost-effectively swap the contact board 1. By selecting different contact boards 1, complete freedom of configuration of the center-spacing or arrangement of the pad fields 2 is possible while using the same electronic units 8.

For securing the electronic units 8 to the contact board 1, clamping straps are used which clamp the electronic units 8 in position on the contact boards so that the screws can be tightened without stressing, as a result of which both the physical as well as the electrical connection is positionally located.

Due to the releasable physical and electrical connection substantial advantages are achieved:

Providing a contact board, which is independent of the electronic testing system, permits individual adaptation of the center-spacing to the circuit board to be tested by simply swapping the contact board. Thus, differing contact boards having differing pad field center-spacings can be employed, with the same electronics system being used in each case.

The contact board need not have an homogenous or uniform center-spacing, i.e., mixed center-spacing being possible, for instance, comprising a conventional basic enter-spacing in one portion of the contact board and a enter-spacing providing double density in the other portion of the contact board.

The center-spacing may also be adapted exclusively for the circuit board with the pad fields being arranged identically to the test points. In this case, the contact board assumes the translator function so that a 1-on-1 adapter can be used to connect a circuit board to the tester.

The geometry of the contact board is thus independent of the electronic testing system.

Relatively many contact points 4 can be grouped in a small region so that a relatively large surface area of the contact board can be served by a single electronic unit, preferably comprising a highly integrated circuit.

It will be appreciated that the invention is not restricted to screws as the mechanism of connection. Pins as well as clamping elements are usable, as well to hold the contact board and the electronic units together. For example, pins inset in the contact board may also be provided which are covered on the upper side of the contact board. It is, however, expedient to use an electrically conductive connecting element arranged in the pad fields so that the connecting element simultaneously serves as a contact element for the contact pins of an adapter.

It has furthermore been discovered that by grouping the contact points 4, arranged for example in a strip-shaped portion 6.5 mm wide (FIG. 1 and FIG. 2), on the underside of the contact board 1, a space between the electronic units 8 and their countersinks is created in which supporting boards or supporting struts 18 can be arranged so that any bulging or strain during testing is totally eliminated and the electronic units 8 are free of physical stresses while being freely accessible from underneath.

The contact board may also be divided into several segments, the individual segments being inserted in a rugged cage of steel or aluminum struts so that adequate stability is assured.

The two example embodiments described above feature in addition the following advantages:

A solderless connecting system is achieved.

An extremely high contact density is achieved.

Physical distortions are compensated by the rubber contact elements.

The connecting system is, in general, flexible and cost-effective.

The surface areas of the contact board or electronic unit connecting the flex conductor are freely configurable, i.e. their contact points are freely arrangeable.

The arrangement of the electronic units is done in the third dimension relative to the contact board.

Figure 3:
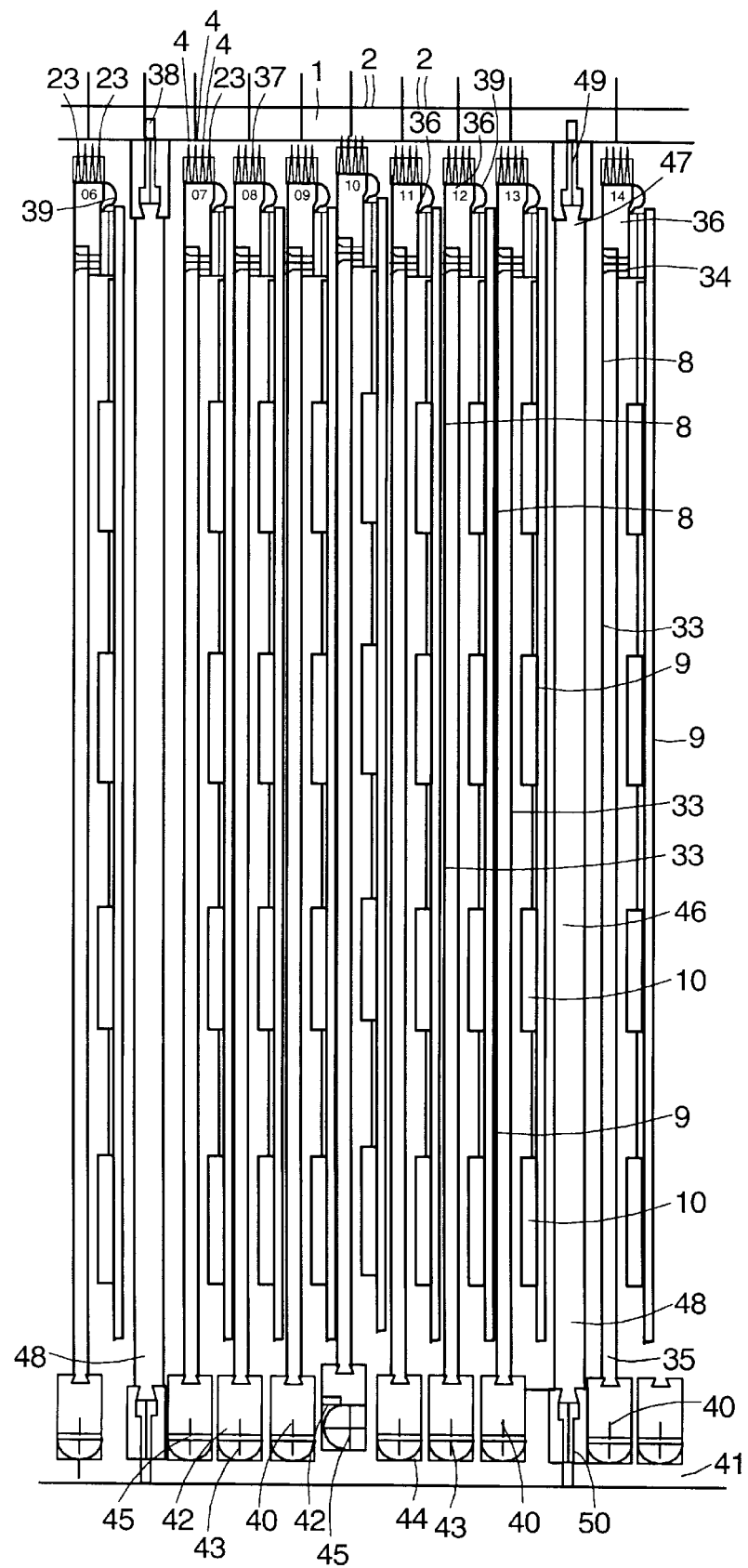
FIG. 3 is a simplified schematic illustration of one portion of the tester in accordance with the invention in another embodiment shown in cross-section, through the contact board.
Figure 4A:
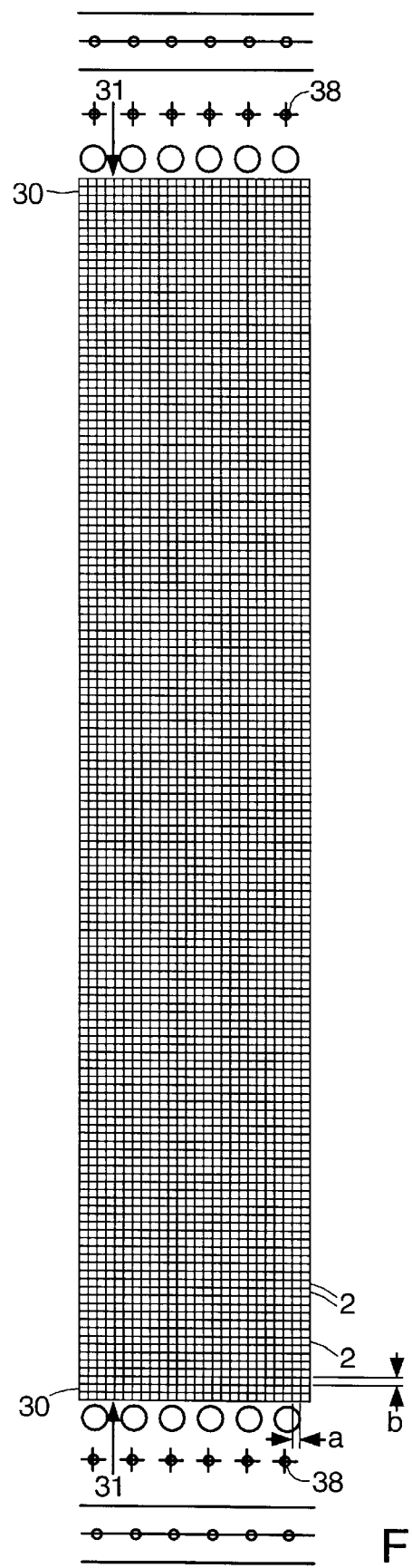
FIGS. 4A and 4B each illustrate a portion of a contact field of the contact board of the tester shown in FIG. 3 as viewed from above.
Figure 4B:
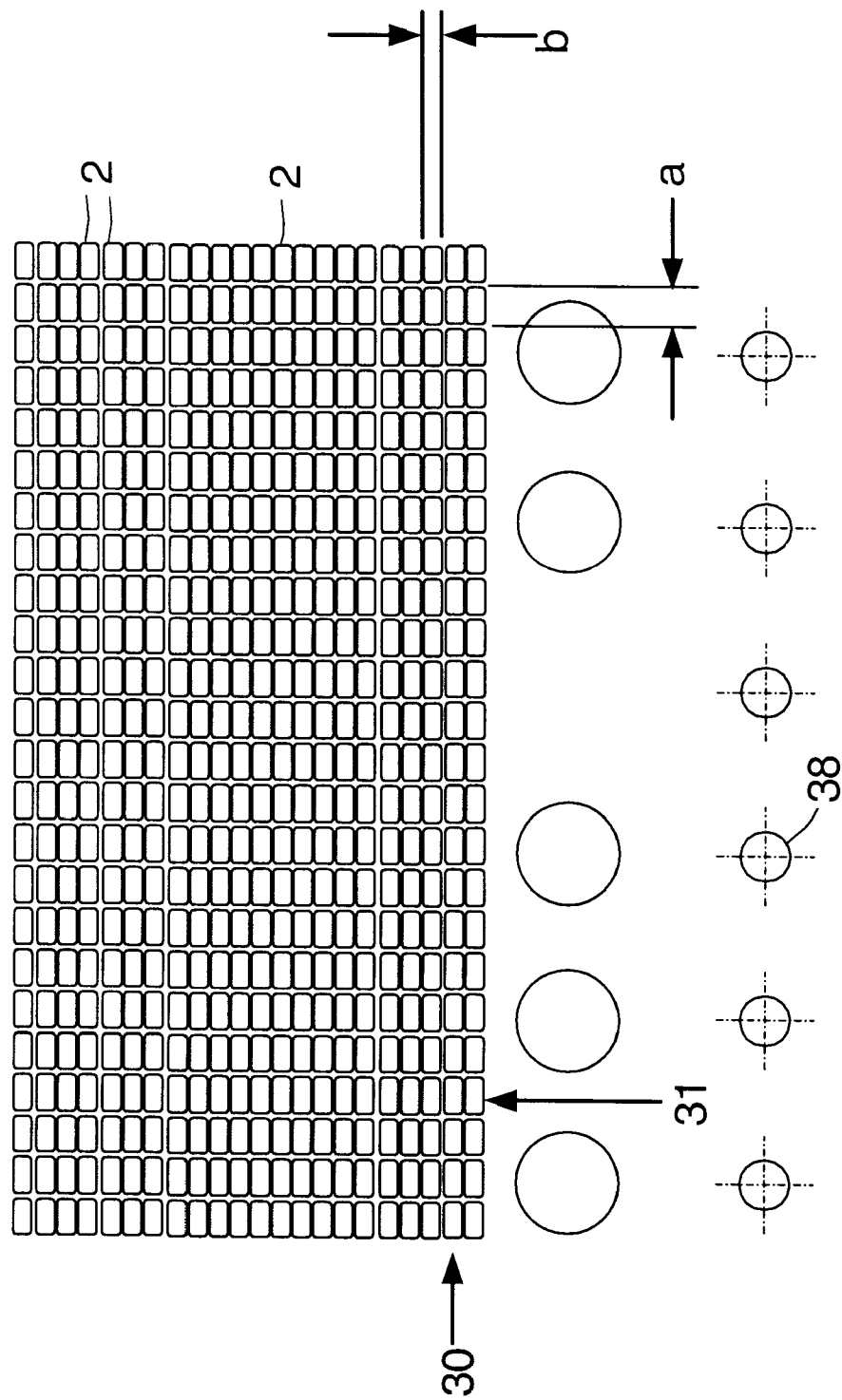

A further example embodiment of the tester in accordance with the invention is shown in FIGS. 3, 4A, and 4B.

This tester comprises in turn a contact board 1 configured as a circuit board provided with pad fields 2 on its upper side (side to be tested). The pad fields 2 form a contact field divided in rows 30 and columns 31, the individual columns 31 having a center-spacing a of e.g. 1/10th of an inch and the rows 30 a center spacing b of 1/20th of an inch, resulting in a pad field density being achieved which is twice that of conventional contact board arrangements having a 1/10th of an inch center spacing.

Configured on the underside of the contact board 1 in turn are contact points 4, each of which is connected to a pad field 2 via a conductor (not shown).

The contact points 4 are arranged grouped in rows, an electronic unit 8 being assigned to each row of contact points. The electronic unit 8 comprises a pressure board 33 having an upper horizontal edge 34 and a lower horizontal edge 35. The pressure boards 33 are vertically disposed to the contact board 1, and provided above each pressure board 33 is a pressure strip 36 securely connected to the pressure board 33.

On the upper side of the pressure strips 36 contact springs 23 are vertically secured. In the edge portion positioning pins 37 are arranged on the upper side of the pressure strips 36, these positioning pins engaging corresponding positioning holes 38 incorporated in the underside of the contact board 1 so that the arrangement of the electronic units 8 is defined relative to the contact board 1 and each of the contact springs 23 is oriented to a corresponding contact point 4.

Secured to each sidewall of the pressure strips 36 by its upper edge is a circuit card 9 so that the circuit cards 9 extend downwards, not fully to the lower edge 35 of the pressure board 33. The circuit cards 9 are preferably disposed with their electronic components 10 facing the pressure board 33. The contact springs 23 are electrically connected to the circuit cards 9 via electrical leads 39 in the region of the pressure strip 36.

The lower edges 35 of the pressure boards 33 are dovetailed, the pressure boards being mounted by their dovetail in correspondly-formed guide grooves in guide strips 40. The guide strips 40 are shiftably incorporated vertically in grooves 42 on a mother-board 41, a crescent-shaped rod 43 being arranged between the bottom of the groove and the underside of each guide strip 40, this crescent-shaped rod 43 has a semicircular cross-section with a curved surface area 44 and flat side surface area 45.

For inserting and removing an electronic unit 8, the crescent-shaped rod 43 is rotated so that its flat side surface area 45 is horizontal. Thus, the guide strips 40 are disposed low down in the grooves 42. By turning the crescent-shaped rod through 90° so that the flat side surfaces are oriented vertically, the guide strips 40 are urged from the grooves 42 slightly upwards so that the electronic unit 8 mounted on the corresponding guide strip 40 is urged upwards against the contact board 1, as a result of which the contact springs 23 are urged into contact with the contact points 4 so that an electrical contact is made.

To prevent the contact board 1 from bulging or experiencing strain, vertical oriented tension struts or tension boards 46 are arranged at regular intervals between the electronic units 8. The tension boards 46 are dovetailed at each of their upper and lower horizontal edges 47, 48 respectively. Each of the edges 47, 48 is mounted in an upper or lower narrow retaining strip 49, 50, these retaining strips featuring corresponding grooves for receiving a dovetail so that between the retaining strips a tension can be transferred to a tension board 46. The upper retaining strip 49 is secured to the underside of the contact board 1 and the lower retaining strip 50 is secured to the mother-board 41 so that the tension boards 46 maintain the contact board 1 and the mother-board 41 at a predetermined spacing from each other, counteracting the tension exerted by the electronic units 8.

By means of this example embodiment all of the aforementioned advantages are achieved to the same extent by the releasable connection between the contact board 1 and the electronic units 8 and by configuring the contact board 1 as a circuit board. In addition to this, the center spacing of the pad fields 2 serving as contact elements can be made smaller since the pad fields 2 are not limited in their minimum size by the size of the screwheads. Accordingly, contact boards 1 having twice or four times the pad field density are achievable as compared to known 1/10th of an inch center-spacings.

Assigning the contact points 4 to the pad fields 2 of the contact board 1 shown in FIG. 4 is done preferably so that the pad fields 2 representing the contact field are made up of eight columns 31 arranged juxtaposed electrically connected to the contact points 4 which are in contact with two electronic units 8. Complete rows 30 of the eight columns 31 are assigned to the two electronic units 8, each of the rows 30 being assigned to the two electronic units 8 alternatively. If one of the two electronic units 8 is omitted in operation then only every second row 30 is connected to an electronic unit 8 and is thus functionable. Due to every second row 30 being "missing" the contact field configured with twice the density is operated only with a single density. Thus, in this example embodiment of the tester in accordance with the invention, the effective density of the contact field can be substantially varied in all or also merely in part by adding or removing one or more electronic units 8.

All example embodiments of the invention as described above differ from known testers by the electrical connection between the contact board 1 and the electronic units 8 being produced solely by a pure pressure connection between the contact points 4 and the contact springs 23 or the rubber contact element 21.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A tester for testing electric circuit boards, comprising:
   a contact board configured as a circuit board including a test side having contact elements adapted to be electrically conductively connected to test points of a circuit board to be tested and a contact side having contact points electrically connected to the contact elements via conductors;

electronic units, forming at least part of a test circuit, that are releasably securable to the contact side of the contact board via pressure contact arrangements to establish electrical connections with the contact points; and connecting strips, each including two walls arranged perpendicularly with respect to each other, one of the electronic units being secured to one wall of each connecting strip and the contact board being secured to the other wall.

2. The tester as set forth in claim 1, wherein the contact points are arranged in groups on the contact board.

3. The tester as set forth in claim 2, further comprising connecting elements that connect the contact board to the electronic units, the connecting elements including an electrically conductive material arranged in the region of each of the contact points of the contact board.

4. The tester as set forth in claim 3, wherein the contact elements form a pad field.

5. The tester as set forth in claim 3, wherein said connecting elements are screws mounted in through-holes of the contact board.

6. The tester as set forth in claim 3, wherein connecting elements are physical tensioning elements.

7. The tester as set forth in claim 1, wherein the contact board is divided into several segments supported by a frame.

8. The tester as set forth in claim 1, wherein the contact elements are arranged on the contact board with a non-homogenous center spacing.

9. The tester as set forth claim 1, wherein the contact elements are arranged on the contact board identically to test points of a circuit board to be tested.

10. The tester as set forth in claim 1, wherein the contact board is supported from below by supporting struts or supporting boards.

11. The tester as set forth in claim 1, wherein the electronic units are releasably securable to the contact side of the contact board such that the contact board is replaceable with a new contact board.

12. The tester as set forth in claim 1, wherein the electronic units are releasably securable to the contact side of the contact board both with respect to mechanical connections and electrical connections.

13. The tester as set forth in claim 1, wherein the electronic units are releasably securable to the contact side of the contact board to form a rigid connection between contact board and electronic units.

14. The tester as set forth in claim 1, wherein the electronic units are directly connected to the contact side of the contact board.

15. The tester as set forth in claim 1, wherein the contact points are located within a region substantially delineated by an extent of the contact elements to which contact points are electrically connected.

16. The tester as set forth in claim 1, wherein the electronic units are secured by a further screw connection to the connecting strips.

17. The tester as set forth in claim 16, further comprising a flex conductor arranged on the walls of the connecting strip in connection with the electronic unit and/or with the contact board, the flex conductor comprising several leads.

18. The tester as set forth in claim 17, further comprising a rubber contact element located between the flex conductor and the electronic unit providing a conductive connection between the electrical leads of the flex conductor and the electronic unit.

19. The tester as set forth in claim 17, further comprising a rubber contact element located between the flex conductor and the contact board providing a conductive connection between the electrical leads of the flex conductor and the contact points of the contact board.

20. A tester for testing electric circuit boards, comprising:

a contact board configured as a circuit board including a test side having contact elements adapted to be electrically conductively connected to test points of a circuit board to be tested and a contact side having contact points electrically connected to the contact elements via conductors; and electronic units, forming at least part of a test circuit, that are releasably securable to the contact side of the contact board via pressure contact arrangements to establish electrical connections with the contact points;

wherein the electronic units comprise a pressure board supported by a mother-board and urging a pressure strip having contact springs arranged on the pressure strip against the contact points of the contact board.

21. The tester as set forth in claim 20, wherein a circuit card is secured to the pressure strip, the circuit card being electrically connected to the contact springs.

22. The tester as set forth in claim 20, wherein the electronic units are oriented by corresponding positioning pins and positioning holes on the contact board.

23. The tester as set forth in claim 20, wherein a pressure mechanism is arranged between the pressure board and the mother-board, the pressure board capable of receiving an upwards acting pressure force by the pressure mechanism.

24. The tester as set forth in claim 23, further comprising vertically oriented tension struts or tension boards connecting the contact board to the mother-board.

25. The tester as set forth in claim 20, further comprising vertically oriented tension struts or tension boards connecting the contact board to the mother-board.

26. The tester as set forth in claim 20, wherein the contact elements are arranged on the testing side of the contact board in columns and rows, the rows or columns in a portion of the contact board being connected alternately to one of two electronic units.

* * * * *